United States Patent
Agneray et al.

(10) Patent No.: US 7,956,543 B2
(45) Date of Patent: Jun. 7, 2011

(54) OPTIMIZATION OF THE EXCITATION FREQUENCY OF A RESONATOR

(75) Inventors: Andre Agneray, Boulogne (FR); Clement Nouvel, Clamart (FR); Julien Couillaud, Athis-Mons (FR)

(73) Assignee: Renault s.a.s., Boulogne (FR)

( * ) Notice: Subject to any disclaimer, the term of this patent is extended or adjusted under 35 U.S.C. 154(b) by 388 days.

(21) Appl. No.: 12/096,382

(22) PCT Filed: Dec. 5, 2006

(86) PCT No.: PCT/FR2006/051282
§ 371 (c)(1),
(2), (4) Date: Oct. 16, 2008

(87) PCT Pub. No.: WO2007/071865
PCT Pub. Date: Jun. 28, 2007

(65) Prior Publication Data
US 2009/0309499 A1 Dec. 17, 2009

(30) Foreign Application Priority Data

Dec. 15, 2005 (FR) .................................. 0512769

(51) Int. Cl.
*H05H 1/24* (2006.01)
(52) U.S. Cl. .............................. 315/111.21; 315/111.51
(58) Field of Classification Search .............. 315/209 M, 315/111.21, 111.51, 111.71; 219/121.48, 219/121.36
See application file for complete search history.

(56) References Cited

U.S. PATENT DOCUMENTS

| | | | | |
|---|---|---|---|---|
| 4,859,909 A | * | 8/1989 | Gualandris et al. | 315/111.81 |
| 5,513,618 A | | 5/1996 | Rich et al. | |
| 5,568,801 A | | 10/1996 | Patterson et al. | |
| 5,949,193 A | * | 9/1999 | Roine et al. | 315/111.51 |
| 6,740,842 B2 | * | 5/2004 | Johnson et al. | 219/121.54 |
| 7,793,632 B2 | * | 9/2010 | Idogawa et al. | 123/169 R |
| 2004/0237950 A1 | | 12/2004 | Metzelard | |

FOREIGN PATENT DOCUMENTS

| | | |
|---|---|---|
| EP | 0 434 217 | 6/1991 |
| FR | 2 649 759 | 1/1991 |

OTHER PUBLICATIONS

U.S. Appl. No. 12/593,482, filed Sep. 28, 2009, Agneray, et al.
U.S. Appl. No. 12/097,012, filed Jun. 11, 2008, Agneray, et al.

* cited by examiner

*Primary Examiner* — David Hung Vu
(74) *Attorney, Agent, or Firm* — Oblon, Spivak, McClelland, Maier & Neustadt, L.L.P.

(57) ABSTRACT

A radio frequency plasma generator power supply, including: an interface that receives a request to determine an optimal control frequency; an output interface configured to be connected to a plasma generation resonator; a power supply module configured to apply a voltage at a set point frequency to the output interface, the voltage, depending on its frequency, selectively unable to allow generation of plasma of the resonator on receipt of a request during a phase optimizing power supply frequency of the generator and able to allow generation of plasma of the resonator during an operating phase; an interface that receives an electrical measurement of power supply of the resonator; a module that determines optimal control frequency, successively provides various set point frequencies to the power supply module on receipt of a request, and determines an optimal control frequency depending on electrical measurements received by the reception interface.

11 Claims, 3 Drawing Sheets

OPTIMIZATION OF THE EXCITATION FREQUENCY OF A RESONATOR

The invention relates to supply of power to a resonator by voltages greater than 100 V and frequencies higher than 1 MHz and in particular the power supply to resonators used in plasma generators.

For application to automobile plasma ignition, resonators whose resonant frequency is higher than 1 MHz are arranged at the spark plug and are typically supplied with voltages greater than 100 V and are subjected to a current greater than 10 A. This application necessitates the use of radiofrequency resonators with a high quality factor and a high-voltage generator, the operating frequency of which is very close to the resonant frequency of the resonator. The more the difference between the resonant frequency of the resonator and the operating frequency of the generator is reduced, the higher the amplification factor (ratio of its output voltage to its input voltage) of the resonator. The higher the quality factor of the resonator, the more the operating frequency of the generator must be close to its resonant frequency.

Numerous parameters have an impact on the resonant frequency: manufacturing tolerances, temperature in the combustion chamber or in the cooling circuit, or aging drift in the resonator components. These parameters have an even more significant impact for the particular case of spark plug coils. Guaranteeing an amplification factor of the resonator is hence a delicate matter.

The invention aims to eliminate this drawback. The invention thus proposes a power-supply device for a radiofrequency plasma generator, comprising:
- an interface for receiving a request to determine an optimal control frequency;
- an output interface intended to be connected to a plasma generation resonator;
- a power-supply module applying a voltage at a set frequency to the output interface, this voltage selectively being unable to allow plasma generation by the resonator when receiving a request or able to allow plasma generation by the resonator;
- an interface for receiving an electrical measurement of the resonator power supply; and
- a module for determining the optimal control frequency, successively providing various set frequencies to the power-supply module when receiving a request, and determining an optimal control frequency as a function of the electrical measurements received.

Other features and advantages of the invention will come out clearly from the description of it below, provided by way of indication and in no way limiting, with reference to the appended drawings in which:

FIG. 1 schematically illustrates a plasma generation device according to the invention;

The invention proposes supplying power in a distinct way to a radiofrequency plasma generator during an operating phase of the generator and during a phase of optimizing the power-supply frequency of this generator. When determination of an optimal control frequency is required, a signal of a specific amplitude or waveform is applied to the terminals of the resonator in order not to lead to plasma generation. A voltage, the frequency of which is modified, is applied to the resonator, an electrical measurement of the power supply to the resonator being carried out for each frequency applied. The optimal control frequency is then determined depending on the electrical measurements carried out.

As the electrical measurements are carried out without the resonator generating plasma, these measures are subject to less interference and necessitate less design of the measurement components. It is also possible to produce a particularly precise closed-loop servocontrol of the power-supply frequency of the resonator. The control frequency is thus kept very close to the resonant frequency of the resonator, even when this resonant frequency tends to vary.

Figure 1:
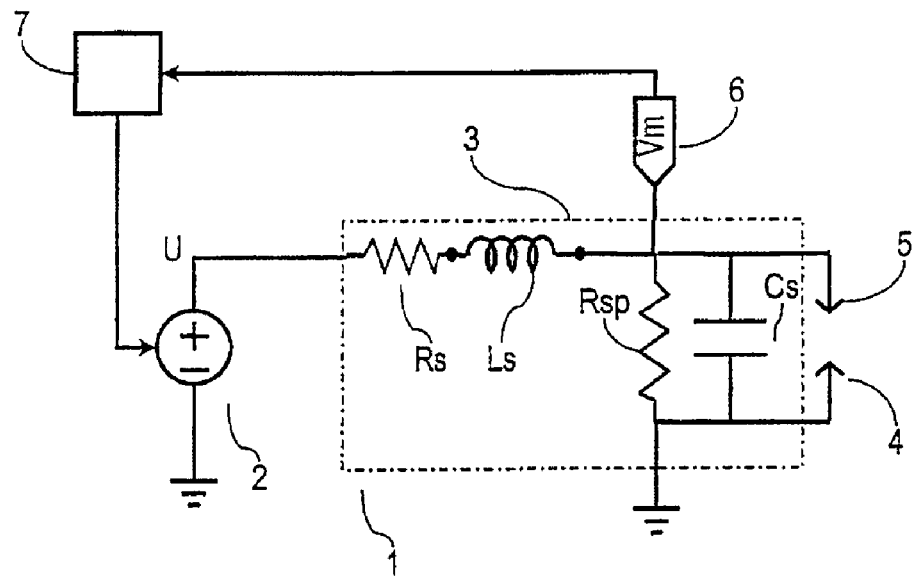

FIG. 1 illustrates a plasma generation device 1. This device 1 is equipped with a series resonator 3 for plasma generation. The resonator 3 comprises a resistor Rs in series with an inductor Ls, and a resistor Rsp in parallel with a capacitor Cs. Ignition electrodes 4 and 5 are connected to the terminals of the capacitor Csp.

The device 1 is also equipped with a power-supply device. This power-supply device comprises in particular a power-supply module 2 applying an output voltage U at an output interface to which the series resonator 3 is connected. The module 2 applies a voltage at a set frequency to the output interface. A control module 7 provides the set frequency to the power-supply module 2.

In order to determine an optimal control frequency for the voltage U, the control module 7 receives a request to determine an optimal control frequency at an interface (not shown). The optimal control frequency is a control frequency approaching the resonant frequency of the resonator 3 as closely as possible. When receiving such a request, the module 2 applies to the output interface a voltage which does not allow the resonator 3 to generate a plasma. When receiving such a request, the module 7 also successively provides various set frequencies to the power-supply module 2.

An electrical measurement of the behavior of the resonator 3 is carried out, for example by using the voltmeter 6 measuring the voltage Vm. For each set frequency provided, the module 7 takes an electrical measurement (by means of a receiver interface that is not illustrated) and then determines an optimal control frequency as a function of these electrical measurements. The electrical measurements allow, for example, determination of a set frequency closest to the resonant frequency of the resonator 3, this set frequency then being used as the optimal control frequency. The optimal control frequency is hence stored, then used as the set frequency for the power-supply module 2 during an operating phase of the device 1, during which a plasma is to be generated between the electrodes 4 and 5.

The plasma generation device 1 may comprise a plasma generation resonator designed to produce controlled ignition of a combustion engine, designed to produce ignition in a particulate filter or designed to produce decontamination ignition in an air conditioning system.

Figure 2:
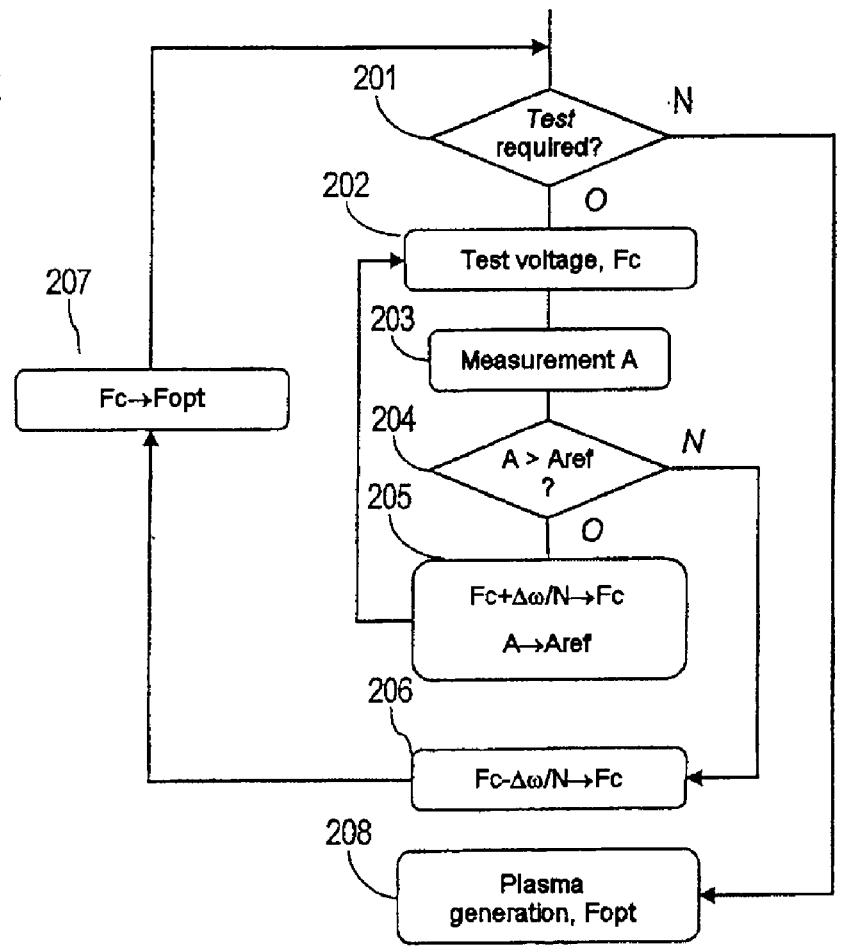
FIG. 2 illustrates an algorithm of an example of the implementation of the invention.

FIG. 2 illustrates an example of an algorithm for determining an optimal control frequency. During a step 201 it is checked whether a test request has been received.

In the absence of a test request, the procedure passes to step 208 and a plasma is generated by the resonator using the optimal control frequency for the voltage applied to the resonator. The power-supply module 2 then applies a voltage sufficient for plasma generation, in a manner known per se, to the resonator 3.

In the presence of a test request, a test voltage is applied by the power-supply module 2 to the resonator 3 during step 202. This voltage is applied at a predetermined set frequency fc, this voltage being such that a plasma cannot be generated by the resonator 3. The predetermined frequency fc is, for example, a frequency that is known with certainty to be lower or higher than the optimal control frequency. In the example illustrated the predetermined frequency fc is less than the resonant frequency of the resonator.

During step 203 an electrical measurement A of the resonator power supply is carried out, this measurement being representative of the difference between the set frequency and the resonant frequency. In the example, it is assumed that the electrical measurement grows in proportion as the difference between the set frequency and the resonant frequency decreases. Examples of electrical measurements will be set out in detail later.

During step 204 the measurement A is compared with a reference Aref, the initial value of which is predetermined. If the measurement A surpasses the reference Aref, the value fc is increased and the reference Aref is updated with the measurement A during step 205. Steps 202 to 204 are then repeated with the new values of fc and Aref.

When it has been determined in step 204 that the measurement A is less than the reference Aref, it is determined that the optimal control frequency was the preceding set frequency. During step 206 the set frequency is updated with its preceding value. During step 207 the optimal control frequency Fopt is fixed at this value of the set frequency. The frequency Fopt may then be used for plasma generation in step 208.

The optimal control frequency may also be determined by extrapolating a characteristic curve of an electrical parameter of the resonator as a function of the excitation frequency, this parameter being a maximum for the resonant frequency. The curve is extrapolated on the basis of several measurements of the resonator power supply. Thus, to approximate an electrical parameter of the resonator with a second order polynomial, three electrical measurements A1, A2 and A3 of this parameter are carried out for three respectively different set frequencies f1, f2 and f3.

It then suffices to solve the following linear system in order to deduce the values a, b and c:

$$A1 = af_1^2 + bf_1 + c$$

$$A2 = af_2^2 + bf_2 + c$$

$$A3 = af_3^2 + bf_3 + c.$$

The resonant frequency is then obtained for the maximum of the curve, i.e. for the value $F_{res} = -b/2a$.

Figure 3:
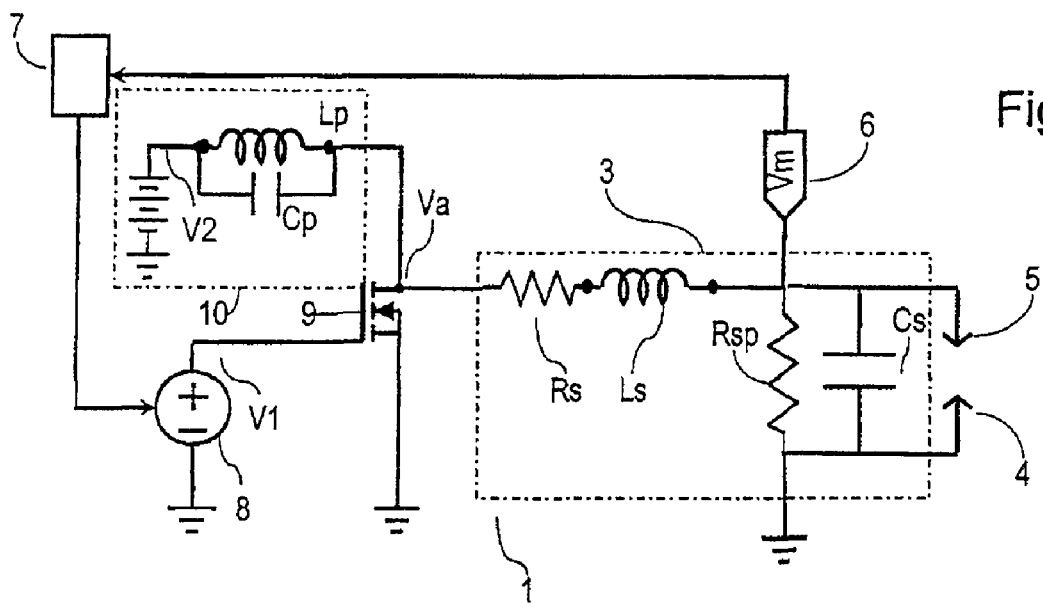
FIG. 3 illustrates an embodiment of a plasma generation device according to the invention.

FIG. 3 shows an embodiment of a plasma generation device according to the invention. The module 7 provides a set frequency to a control signal generator 8. This generator 8 applies a control voltage V1 at the set frequency fc to the gate of a MOSFET power transistor 9. The transistor 9 serves as a switch controlled by this control signal. The transistor 9 allows the voltage Va to be applied at the output interface connected to the resonator.

As described in the patent application EP-A-1 515 594, a parallel resonant circuit 10 is connected between an intermediate voltage source V2 and the drain of the transistor 9. This circuit 10 comprises an inductor Lp and a capacitor Cp.

Figure 4:
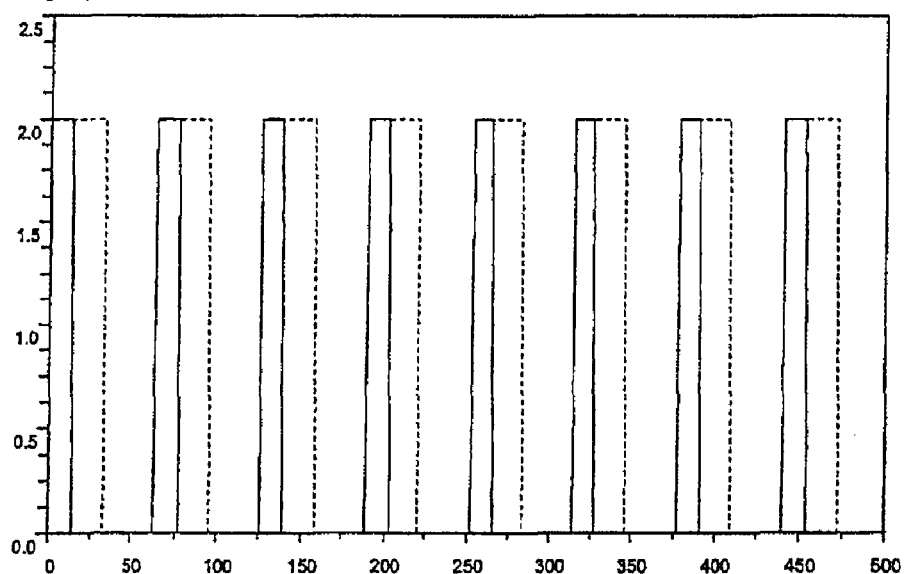
FIG. 4 illustrates a first example of control signals applicable to the switch of FIG. 3.

FIG. 4 illustrates an example of a control signal applied by the generator 8 to the gate of the transistor 9. The continuous lines represent the control signal while receiving a request to determine an optimal control frequency, the dashed lines represent the control signal while controlling plasma generation. In order to avoid plasma generation during the optimization, the duty cycle of the control signal is reduced sufficiently in relation to a plasma generation control. Thus, the inductor Ls of FIG. 3 is not loaded for a sufficient duration to allow the resonator 3 to generate a plasma. The set frequencies used for the control signal during the optimization are thus of the order of magnitude of resonant frequency of the resonator 3. Such a control signal may advantageously be used without reducing the voltage V2, in order not to increase the complexity of the plasma generation device 1.

Figure 5:
FIG. 5 illustrates a second example of a control signal applicable to the switch of FIG. 3.
Figure 5:

FIG. 5 illustrates another example of a control signal applied by the generator 8 to the gate of the transistor 9. The upper diagram corresponds to a plasma generation control signal, the lower diagram corresponds to the control signal during an optimization.

When a plasma is being generated the control signal is a regular pulse train, the frequency of which is of the order of magnitude of the resonant frequency of the resonator 3. In order not to generate plasma during optimization, the pulse train of the optimization control signal includes only part of the pulses of the corresponding plasma generation control signal. In this way, in the example, two successive pulses in four have been removed from the pulse train. Even if the frequency of the switching transistor 9 is then no longer of the order of magnitude of the resonant frequency of the resonator 3, low-amplitude harmonics of the pulses applied to the resonator allow the resonator 3 to be excited in order to determine the optimal control frequency to be used during plasma generation.

It is also conceivable to prevent plasma generation during optimization by using an intermediate voltage level V2, reduced in relation to the voltage level V2 used during plasma generation.

The following rules may, in particular, be used to determine frequency spacings for the set frequency during optimization.

On the basis of the circuit of FIG. 1, the angular eigenfrequency of the resonator 3 is determined:

$$\omega 0 = \sqrt{\frac{Rs + Rsp}{Ls \cdot Cs \cdot Rsp}}$$

Het $\xi$ be given by:

$$\xi = \frac{1}{2}\sqrt{\frac{Rsp}{Rsp + Rs}}\left(\frac{1}{Rsp}\sqrt{\frac{Ls}{Cs}} + Rs\sqrt{\frac{Cs}{Ls}}\right)$$

At resonance, $\omega = \omega_0$ and $Vm(\omega_0) = V_{MAX}$. It is then possible to define the ratio:

$$\left|\frac{V\max}{U}\right| = \frac{Rsp}{Rsp + Rs} \cdot \frac{1}{2\xi}$$

With the design of the circuit used, Rsp>>Rs. Hence:

$$\left|\frac{V\max}{U}\right| = \frac{1}{2\xi}$$

For an angular frequency different from the resonant angular frequency the following ratio is obtained:

$$\left|\frac{Vm}{U}\right| = \frac{Rsp}{Rsp+Rs} \cdot \frac{1}{\sqrt{1+(4\xi^2-2)\frac{\omega^2}{\omega_0^2}+\frac{\omega^4}{\omega_0^4}}} = A$$

This coefficient A may be at the discretion of the plasma generator manufacturer. This coefficient A allows definition of a range in which the resonant frequency of each plasma generation resonator must be included.

Consequently, by knowing the values of A and U in advance, it is possible to determine the minimum precision in angular frequency necessary in order for a servosystem to use an angular frequency in this range.

Let $\omega_1$ and $\omega_2$ be such that $Vm(\omega_1)=Vm(\omega_2)=A*U$.

Let $\Delta\omega=|\omega_1-\omega_2|$, so that the angular frequency generated by the servosystem belongs to said range, the servo spacing must be at most $\Delta\omega/2$. In this way, for maximum precision of the servocontrol of the angular frequency, a servo spacing of $\Delta\omega/N$ is used, with N being a whole number assuming the highest value possible.

To attain the optimum excitation angular frequency of the plasma generation resonator, the servosystem will modify the angular frequency in increments of $\Delta\omega/N$. The measurement of Vm allows determination of the angular frequency $\omega$ for which:

$\omega=\omega_{ref}+i\Delta\omega/N\approx\omega_0$, with i a signed integer and $\omega_{ref}$ a reference angular frequency used at the start of the angular frequency servocontrol.

It is possible to study the response of the voltage Vm to a train of periodic gaps in the voltage U, the angular frequency of which is set at the resonant frequency $\omega_0$.

Setting n to be an integer number, the voltage U(t) is expressed in the following manner:

$U(t)=0$ if $2n\pi/\omega_0 < t < (2n+1)\pi/\omega_0$ $U(t)=U_0$ if $(2n+1)\pi/\omega_0 \leq t \leq (2n+2)\pi/\omega_0$.

At the nth gap the following maximum and minimum voltages are obtained:

$V\max((2n+1)\pi/\omega_0)=U_0(1+(e^{-(n+1)\xi\pi}-e^{\xi\pi})/e^{-\xi\pi}-1))$ $V\min((2n\pi/\omega_0)=-U_0(1+(e^{-(n+1)\xi\pi}-e^{\xi\pi})/(e^{-\xi\pi}-1))$ Hence yielding:

$V\max((2n+1)\pi/\omega_0)\to U_0/\xi\pi$ when $n\to\infty$ $V\min((2n\pi/\omega_0)\to -U_0/(e^{-\xi\pi}-1)$ when $n\to\infty$.

The electrical measurement of the supply of power to the resonator is intended to characterize the overvoltage coefficient $Q=Vm/Va$ of the resonator 3. Various parameters, independent of the intermediate voltage V2, may be measured in order to obtain a measurement representing the Q-factor.

It is possible, for example, to calculate admittances on the basis of a measurement of the current Im flowing through the resonator 3 and on the basis of various voltages.

It is possible, for example, to define the following admittances:

Ad=Im/Vm; this admittance implies determination of the voltage Vm and the current Im;

Ai=Im/Va=Ad·Q; although the values of Q and Ad vary as a function of the excitation frequency of the resonator, Q varies more rapidly than Ad as resonance is approached. Hence, the maximum of Ai corresponds to the maximum of Q;

Aa=Im/V2; for this admittance it may be assumed that the value of V2 is constant and to measure the current Im alone.

It is of course also possible to use any other measurement of a suitable electrical parameter which varies as a function of frequency allows determination of the optimal control frequency.

As the values of these admittances are at a maximum when the excitation frequency of the resonator is equal to its resonant frequency, these electrical parameters allow determination of the optimal control frequency.

Figure 6:
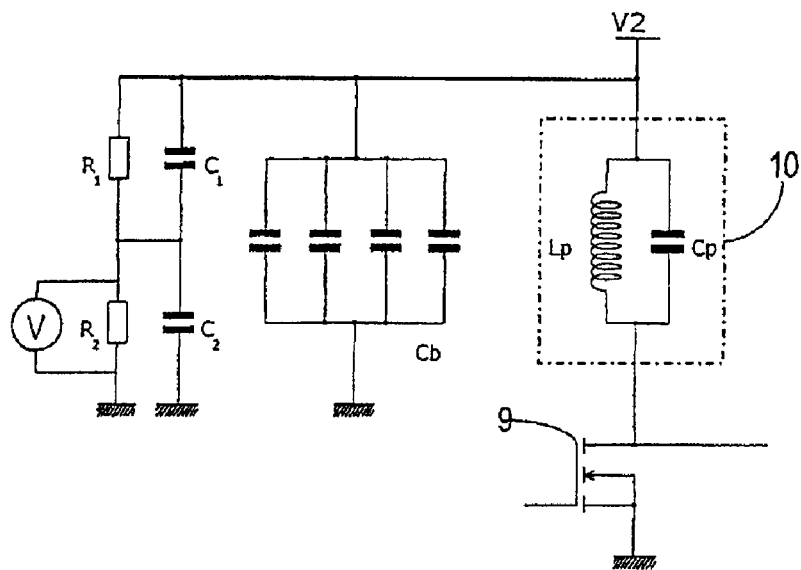
FIG. 6 illustrates a first example of a circuit for measuring an electrical parameter of the resonator of FIG. 3.
Figure 7:
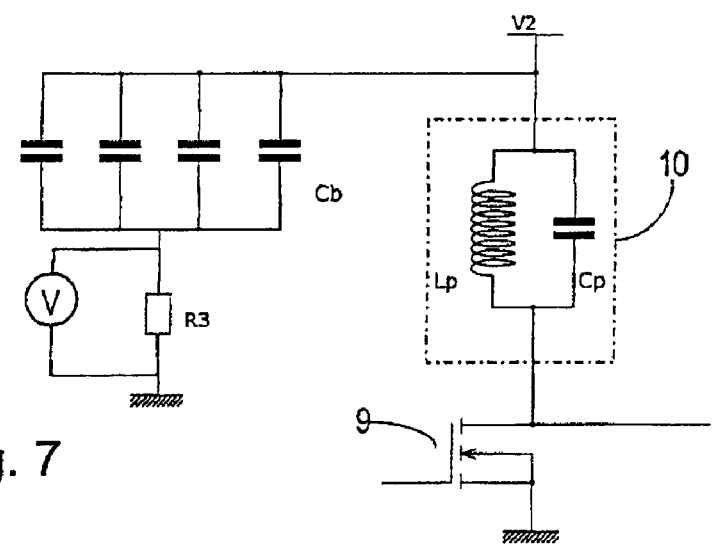
FIG. 7 illustrates a second example of a circuit for measuring an electrical parameter of the resonator of FIG. 3.

The FIGS. 6 and 7 illustrate examples of means of carrying out an electrical measurement of the power supply to the resonator.

In FIG. 6 a voltage divider bridge is formed in accordance with the equation R2·C2=R1·C1, the capacitors C1 and C2 being storage capacitors. The measurement of the voltage at the terminals of R2 allows the energy consumed by a pulse train to be deduced.

In FIG. 7 the voltage at the terminals of a resistor R3 is measured in order to measure the current flowing through the capacitors Cb when the transistor 9 is switched on.

A variant also allows a malfunction of the resonator to be detected, in an application to a combustion engine. The invention thus proposes a device for detecting malfunction based on the determination of a reference frequency in normal operation. This detection device comprises:

an interface for receiving signals of measurements of operating parameters of the combustion engine;

an interface for output of a reference signal;

a memory module storing relations between measurement signals and the frequency of a reference signal in normal operation of the combustion engine; and a module determining the frequency of a reference signal as a function of signals of measurements received on the reception interface and of relations stored in the memory module.

A comparison module compares the reference frequency with the optimal control frequency determined by the power-supply device. When the difference between these frequencies passes a predetermined threshold, the device for detecting malfunction of the resonator generates an error signal.

The invention claimed is:

1. A power-supply device for a radiofrequency plasma generator, comprising:

a first interface that receives a request to determine an optimal control frequency;

an output interface configured to be connected to a plasma generation resonator;

a power-supply module configured to apply a voltage at a set frequency to the output interface, the voltage selectively, depending on its frequency, being unable to allow plasma generation by the resonator when receiving a request during a phase of optimizing the power-supply frequency of the generator and able to allow plasma generation during an operation phase of the generator;

a second interface that receives an electrical measurement of the resonator power supply; and a module that determines an optimal control frequency configured to successively provide various set frequencies to the power-supply module when receiving a request, and to determine an optimal control frequency as a function of the electrical measurements received by the second interface.

2. The device as claimed in claim 1, wherein the module that determines the optimal control frequency determines an optimal control frequency approximately equal to the resonant frequency of the plasma generation resonator.

3. The device as claimed in claim 1, wherein the power-supply module comprises:
   a generator of a control signal at the set frequency;
   a switch controlled by the control signal and connected to the output interface.

4. The device as claimed in claim 3, wherein during reception of a request to determine an optimal control frequency, the frequency of the set signal is of an order of magnitude of the resonant frequency of the resonator configured to be connected to the output interface and the control signal generator reduces the duty cycle of the control signal.

5. The device as claimed in claim 3, wherein during reception of a request to determine an optimal control frequency, the control signal generated includes part of the pulses of a regular pulse train having a frequency of an order of magnitude of the resonant frequency of the resonator configured to be connected to the output interface.

6. The device as claimed in claim 1, wherein the peak voltage level applied to the output interface is reduced when a request to determine an optimal control frequency is being received.

7. The device as claimed in claim 1, wherein the module that determines the optimal control frequency compares two successive values of electrical measurements received, modifies the set frequency in a first direction if the difference between the successive values has a first sign, and determines that the preceding set frequency is the optimal control frequency if the difference between the successive values has a second sign.

8. A plasma generation device comprising:
   a power-supply device as claimed in claim 1; and
   a plasma generation resonator connected to the output interface of the power-supply device.

9. The plasma generation device as claimed in claim 8, wherein the plasma generation device is configured to produce an ignition in one of following implementations: controlled ignition of a combustion engine, ignition in a particulate filter, decontamination ignition in an air conditioning system.

10. The plasma generation device as claimed in claim 8, further comprising a module that electrically measures power supply of the resonator connected to the interface for receiving an electrical measurement.

11. The plasma generation device as claimed in claim 8, wherein the plasma generation resonator is configured to produce controlled ignition of a combustion engine and comprising a device for detecting malfunction comprising:
   an interface that receives signals of measurements of operating parameters of the combustion engine;
   an interface for output of a reference signal;
   a memory module that stores relations between measurement signals and the frequency of a reference signal in normal operation of the combustion engine; and
   a module that determines the frequency of a reference signal as a function of signals of measurements received on the reception interface and of relations stored in the memory module; and
   a comparison module that compares the reference frequency with an optimal control frequency determined by the power-supply device and generating an error signal when the difference between these frequencies passes a predetermined threshold.

\* \* \* \* \*